US007167944B1

(12) United States Patent
Estakhri

(10) Patent No.: US 7,167,944 B1
(45) Date of Patent: Jan. 23, 2007

(54) BLOCK MANAGEMENT FOR MASS STORAGE

(75) Inventor: Petro Estakhri, Pleasanton, CA (US)

(73) Assignee: Lexar Media, Inc., Fremont, CA (US)

( * ) Notice: Subject to any disclaimer, the term of this patent is extended or adjusted under 35 U.S.C. 154(b) by 453 days.

(21) Appl. No.: 10/455,550

(22) Filed: Jun. 4, 2003

Related U.S. Application Data

(63) Continuation-in-part of application No. 09/620,544, filed on Jul. 21, 2000, now Pat. No. 6,978,342.

(51) Int. Cl.
G06F 12/00 (2006.01)
G06F 12/08 (2006.01)

(52) U.S. Cl. ............... 711/103; 711/165; 711/203; 711/156; 711/159

(58) Field of Classification Search ............... None
See application file for complete search history.

(56) References Cited

U.S. PATENT DOCUMENTS

| | | | |
|---|---|---|---|
| 4,099,069 A | 7/1978 | Cricchi et al. |
| 4,130,900 A | 12/1978 | Watanabe |
| 4,210,959 A | 7/1980 | Wozniak |
| 4,309,627 A | 1/1982 | Tabata |
| 4,355,376 A | 10/1982 | Gould |
| 4,398,248 A | 8/1983 | Hsia et al. |
| 4,405,952 A | 9/1983 | Slakmon |
| 4,414,627 A | 11/1983 | Nakamura |
| 4,450,559 A | 5/1984 | Bond et al. |
| 4,456,971 A | 6/1984 | Fukuda et al. |
| 4,468,730 A | 8/1984 | Dodd et al. |
| 4,473,878 A | 9/1984 | Zolnowsky et al. |
| 4,476,526 A | 10/1984 | Dodd |
| 4,498,146 A | 2/1985 | Martinez |
| 4,525,839 A | 6/1985 | Nozawa et al. |
| 4,532,590 A | 7/1985 | Wallach et al. |

(Continued)

FOREIGN PATENT DOCUMENTS

AU 0 557 723 1/1987

(Continued)

OTHER PUBLICATIONS

Science Forum, Inc., Flash Memory Symposium '95, symposium, 1995, 13 pgs.; Hongo, Bunkyo-ku, Tokyo.

(Continued)

Primary Examiner—B. James Peikari
(74) Attorney, Agent, or Firm—Law Offices of Imam

(57) ABSTRACT

An embodiment of the present invention includes a nonvolatile memory system comprising nonvolatile memory for storing sector information, the nonvolatile memory being organized into blocks with each block including a plurality of sectors, each sector identified by a logical block address and for storing sector information. A controller is coupled to the nonvolatile memory for writing sector information to the latter and for updating the sector information, wherein upon updating sector information, the controller writes to the next free or available sector(s) of a block such that upon multiple re-writes or updating of sector information, a plurality of blocks are substantially filled with sector information and upon such time, the controller rearranges the updated sector information in sequential order based on their respective logical block addresses thereby increasing system performance and improving manufacturing costs of the controller.

10 Claims, 5 Drawing Sheets

U.S. PATENT DOCUMENTS

| | | |
|---|---|---|
| 4,609,833 A | 9/1986 | Guterman |
| 4,616,311 A | 10/1986 | Sato |
| 4,654,847 A | 3/1987 | Dutton |
| 4,710,871 A | 12/1987 | Belknap et al. |
| 4,746,998 A | 5/1988 | Robinson et al. |
| 4,748,320 A | 5/1988 | Yorimoto et al. |
| 4,757,474 A | 7/1988 | Fukushi et al. |
| 4,774,700 A | 9/1988 | Satoh et al. |
| 4,780,855 A | 10/1988 | Iida et al. |
| 4,788,665 A | 11/1988 | Fukuda et al. |
| 4,797,543 A | 1/1989 | Watanabe |
| 4,800,520 A | 1/1989 | Iijima |
| 4,829,169 A | 5/1989 | Watanabe |
| 4,843,224 A | 6/1989 | Ohta et al. |
| 4,896,262 A | 1/1990 | Wayama et al. |
| 4,914,529 A | 4/1990 | Bonke |
| 4,920,518 A | 4/1990 | Nakamura et al. |
| 4,924,331 A | 5/1990 | Robinson et al. |
| 4,943,745 A | 7/1990 | Watanabe et al. |
| 4,953,122 A | 8/1990 | Williams |
| 4,970,642 A | 11/1990 | Yamamura |
| 4,970,727 A | 11/1990 | Miyawaki et al. |
| 5,070,474 A | 12/1991 | Tuma et al. |
| 5,093,785 A | 3/1992 | Iijima |
| 5,168,465 A | 12/1992 | Harari |
| 5,198,380 A | 3/1993 | Harari |
| 5,200,959 A | 4/1993 | Gross et al. |
| 5,218,695 A | 6/1993 | Noveck et al. |
| 5,220,518 A | 6/1993 | Haq |
| 5,226,168 A | 7/1993 | Kobayashi et al. |
| 5,227,714 A | 7/1993 | Lou |
| 5,253,351 A | 10/1993 | Yamamoto et al. |
| 5,267,218 A | 11/1993 | Elbert |
| 5,268,318 A | 12/1993 | Harari |
| 5,268,870 A | 12/1993 | Harari |
| 5,270,979 A | 12/1993 | Harari et al. |
| 5,293,560 A | 3/1994 | Harari |
| 5,297,148 A | 3/1994 | Harari et al. |
| 5,303,198 A | 4/1994 | Adachi et al. |
| 5,305,276 A | 4/1994 | Uenoyama |
| 5,305,278 A | 4/1994 | Inoue |
| 5,315,541 A | 5/1994 | Harari et al. |
| 5,315,558 A | 5/1994 | Hag |
| 5,329,491 A | 7/1994 | Brown et al. |
| 5,337,275 A | 8/1994 | Garner |
| 5,341,330 A | 8/1994 | Wells et al. |
| 5,341,339 A | 8/1994 | Wells |
| 5,341,341 A | 8/1994 | Fukuzo |
| 5,353,256 A | 10/1994 | Fandrich et al. |
| 5,357,475 A | 10/1994 | Hasbun et al. |
| 5,359,569 A | 10/1994 | Fujita et al. |
| 5,365,127 A | 11/1994 | Manley |
| 5,369,615 A | 11/1994 | Harari et al. |
| 5,371,702 A | 12/1994 | Nakai et al. |
| 5,381,539 A | 1/1995 | Yanai et al. |
| 5,382,839 A | 1/1995 | Shinohara |
| 5,384,743 A | 1/1995 | Rouy |
| 5,388,083 A | 2/1995 | Assar et al. |
| 5,396,468 A | 3/1995 | Harari et al. |
| 5,404,485 A | 4/1995 | Ban |
| 5,406,527 A | 4/1995 | Honma |
| 5,418,752 A | 5/1995 | Harari et al. |
| 5,422,842 A | 6/1995 | Cernea et al. |
| 5,422,856 A | 6/1995 | Sasaki et al. |
| 5,428,621 A | 6/1995 | Mehrotra et al. |
| 5,430,682 A | 7/1995 | Ishikawa et al. |
| 5,430,859 A | 7/1995 | Norman et al. |
| 5,431,330 A | 7/1995 | Wieres |
| 5,434,825 A | 7/1995 | Harari |
| 5,438,573 A | 8/1995 | Mangan et al. |
| 5,465,235 A | 11/1995 | Miyamoto |
| 5,465,338 A | 11/1995 | Clay |
| 5,471,478 A | 11/1995 | Mangan et al. |
| 5,473,765 A | 12/1995 | Gibbons et al. |
| 5,479,638 A | 12/1995 | Assar et al. |
| 5,485,595 A | 1/1996 | Assar et al. |
| 5,490,117 A | 2/1996 | Oda et al. |
| 5,495,442 A | 2/1996 | Cernea et al. |
| 5,504,760 A | 4/1996 | Harari et al. |
| 5,508,971 A | 4/1996 | Cernea et al. |
| 5,513,138 A | 4/1996 | Manabe et al. |
| 5,515,333 A | 5/1996 | Fujita et al. |
| 5,519,847 A | 5/1996 | Fandrich et al. |
| 5,523,980 A | 6/1996 | Sakui et al. |
| 5,524,230 A | 6/1996 | Sakaue et al. |
| 5,530,673 A | 6/1996 | Tobita et al. |
| 5,530,828 A | 6/1996 | Kaki et al. |
| 5,530,938 A | 6/1996 | Akasaka et al. |
| 5,532,962 A | 7/1996 | Auclair et al. |
| 5,532,964 A | 7/1996 | Cernea et al. |
| 5,534,456 A | 7/1996 | Yuan et al. |
| 5,535,328 A | 7/1996 | Harari et al. |
| 5,541,551 A | 7/1996 | Brehner et al. |
| 5,544,118 A | 8/1996 | Harari |
| 5,544,356 A | 8/1996 | Robinson et al. |
| 5,552,698 A | 9/1996 | Tai et al. |
| 5,554,553 A | 9/1996 | Harari |
| 5,563,825 A | 10/1996 | Cernea et al. |
| 5,566,314 A | 10/1996 | DeMarco et al. |
| 5,568,439 A | 10/1996 | Harari |
| 5,572,466 A | 11/1996 | Sukegawa |
| 5,579,502 A | 11/1996 | Konishi et al. |
| 5,581,723 A | 12/1996 | Hasbun et al. |
| 5,583,812 A | 12/1996 | Harari |
| 5,592,415 A | 1/1997 | Kato et al. |
| 5,592,420 A | 1/1997 | Cernea et al. |
| 5,596,526 A | 1/1997 | Assar et al. |
| 5,598,370 A | 1/1997 | Niijima et al. |
| 5,602,987 A | 2/1997 | Harari et al. |
| 5,603,001 A | 2/1997 | Sukegawa et al. |
| 5,606,660 A | 2/1997 | Estakhri et al. |
| 5,611,067 A | 3/1997 | Okamoto et al. |
| 5,640,528 A | 6/1997 | Harney et al. |
| 5,642,312 A | 6/1997 | Harari |
| 5,648,929 A | 7/1997 | Miyamoto |
| 5,663,901 A | 9/1997 | Wallace et al. |
| 5,693,570 A | 12/1997 | Cernea et al. |
| 5,712,819 A | 1/1998 | Harari |
| 5,719,808 A | 2/1998 | Harari et al. |
| 5,723,990 A | 3/1998 | Roohparvar |
| 5,734,567 A | 3/1998 | Griffiths et al. |
| 5,745,418 A | 4/1998 | Ma et al. |
| 5,754,567 A | 5/1998 | Norman |
| 5,757,712 A | 5/1998 | Nagel et al. |
| 5,758,100 A | 5/1998 | Odisho |
| 5,761,117 A | 6/1998 | Uchino et al. |
| 5,768,190 A | 6/1998 | Tanaka et al. |
| 5,768,195 A | 6/1998 | Nakamura et al. |
| 5,773,901 A | 6/1998 | Kantner |
| 5,778,418 A | 7/1998 | Auclair et al. |
| 5,781,478 A | 7/1998 | Takeuchi et al. |
| 5,787,445 A | 7/1998 | Daberko |
| 5,787,484 A | 7/1998 | Norman |
| RE35,881 E | 8/1998 | Barrett et al. |
| 5,799,168 A | 8/1998 | Ban |
| 5,802,551 A | 9/1998 | Komatsu et al. |
| 5,809,515 A | 9/1998 | Kaki et al. |
| 5,809,558 A | 9/1998 | Matthews et al. |
| 5,809,560 A | 9/1998 | Schneider |
| 5,818,350 A | 10/1998 | Estakhri et al. |
| 5,818,781 A | 10/1998 | Estakhri et al. |
| 5,822,245 A | 10/1998 | Gupta et al. |
| 5,822,252 A | 10/1998 | Lee et al. |
| 5,822,781 A | 10/1998 | Wells et al. |

| | | | | | | |
|---|---|---|---|---|---|---|
| 5,831,929 A | 11/1998 | Manning | | 6,345,367 B1 | 2/2002 | Sinclair |
| 5,835,935 A | 11/1998 | Estakhri et al. | | 6,374,337 B1 | 4/2002 | Estakhri |
| 5,838,614 A | 11/1998 | Estakhri et al. | | 6,385,667 B1 | 5/2002 | Estakhri et al. |
| 5,845,313 A | 12/1998 | Estakhri et al. | | 6,393,513 B1 | 5/2002 | Estakhri et al. |
| 5,847,552 A | 12/1998 | Brown | | 6,397,314 B1 | 5/2002 | Estakhri et al. |
| 5,860,083 A | 1/1999 | Sukegawa | | 6,411,546 B1 | 6/2002 | Estakhri et al. |
| 5,860,124 A | 1/1999 | Matthews et al. | | 6,467,021 B1 | 10/2002 | Sinclair |
| 5,862,099 A | 1/1999 | Gannage et al. | | 6,490,649 B1 | 12/2002 | Sinclair |
| 5,890,192 A | 3/1999 | Lee et al. | | 6,567,307 B1 | 5/2003 | Estakhri |
| 5,901,086 A | 5/1999 | Wang et al. | | 6,578,127 B1 | 6/2003 | Sinclair |
| 5,907,856 A | 5/1999 | Estakhri et al. | | 6,587,382 B1 | 7/2003 | Estakhri et al. |
| 5,909,586 A | 6/1999 | Anderson | | 6,711,059 B1 | 3/2004 | Sinclair et al. |
| 5,920,884 A | 7/1999 | Jennings, III et al. | | 6,721,819 B1 | 4/2004 | Estakhri et al. |
| 5,924,113 A | 7/1999 | Estakhri et al. | | 6,721,843 B1 | 4/2004 | Estakhri |
| 5,928,370 A | 7/1999 | Asnaashari | | 6,725,321 B1 | 4/2004 | Sinclair et al. |
| 5,930,815 A | 7/1999 | Estakhri et al. | | 6,728,851 B1 | 4/2004 | Estakhri et al. |
| 5,933,368 A | 8/1999 | Ma et al. | | 6,751,155 B1 | 6/2004 | Gorobets |
| 5,933,846 A | 8/1999 | Endo | | 6,757,800 B1 | 6/2004 | Estakhri et al. |
| 5,936,971 A | 8/1999 | Harari et al. | | 6,772,274 B1 | 8/2004 | Estakhri |
| 5,937,425 A | 8/1999 | Ban | | 6,813,678 B1 | 11/2004 | Sinclair et al. |
| 5,953,737 A | 9/1999 | Estakhri et al. | | 6,898,662 B1 | 5/2005 | Gorobets |
| 5,956,473 A | 9/1999 | Ma et al. | | 6,912,618 B1 | 6/2005 | Estakhri et al. |
| 5,959,926 A | 9/1999 | Jones et al. | | 6,950,918 B1 | 9/2005 | Estakhri |
| 5,966,727 A | 10/1999 | Nishino | | 6,957,295 B1 | 10/2005 | Estakhri |
| 5,986,933 A | 11/1999 | Takeuchi et al. | | 6,973,519 B1 | 12/2005 | Estakhri et al. |
| 5,987,563 A | 11/1999 | Itoh et al. | | 6,978,342 B1 | 12/2005 | Estakhri et al. |
| 5,987,573 A | 11/1999 | Hiraka | | 7,000,064 B1 | 2/2006 | Payne et al. |
| 5,991,849 A | 11/1999 | Yamada et al. | | 2003/0033471 A1 | 2/2003 | Lin et al. |
| 6,011,322 A | 1/2000 | Stumfall et al. | | | | |
| 6,011,323 A | 1/2000 | Camp | | FOREIGN PATENT DOCUMENTS | | |
| 6,018,265 A | 1/2000 | Keshtbod | | | | |
| 6,021,408 A | 2/2000 | Ledain et al. | | EP | 0 220 718 A2 | 5/1987 |
| 6,026,020 A | 2/2000 | Matsubara et al. | | EP | 0 243 5003 A1 | 11/1987 |
| 6,026,027 A | 2/2000 | Terrell, II et al. | | EP | 0 392 895 A2 | 10/1990 |
| 6,034,897 A | 3/2000 | Estakhri et al. | | EP | 0 424 191 A2 | 4/1991 |
| 6,035,357 A | 3/2000 | Sakaki | | EP | 0 489 204 A1 | 6/1992 |
| 6,040,997 A | 3/2000 | Estakhri | | EP | 0 522 780 A2 | 1/1993 |
| 6,041,001 A | 3/2000 | Estakhri | | EP | 0 544 252 A2 | 6/1993 |
| 6,047,352 A | 4/2000 | Lakhani et al. | | EP | 0 613 151 A2 | 8/1994 |
| 6,055,184 A | 4/2000 | Acharya et al. | | EP | 0 617 363 A2 | 9/1994 |
| 6,055,188 A | 4/2000 | Takeuchi et al. | | EP | 0 619 541 A2 | 10/1994 |
| 6,069,827 A | 5/2000 | Sinclair | | EP | 0 663 636 A1 | 7/1995 |
| 6,072,796 A | 6/2000 | Christensen et al. | | EP | 0 686 976 A2 | 12/1995 |
| 6,076,137 A | 6/2000 | Asnaashari | | EP | 0 897 579 B1 | 7/2000 |
| 6,081,447 A | 6/2000 | Lofgren et al. | | EP | 0 891 580 B1 | 11/2000 |
| 6,081,878 A | 6/2000 | Estakhri et al. | | EP | 0 896 699 B1 | 11/2000 |
| 6,084,483 A | 7/2000 | Keshtbod | | EP | 0 852 766 B1 | 5/2001 |
| 6,097,666 A | 8/2000 | Sakui et al. | | EP | 0 852 765 B1 | 9/2001 |
| 6,115,785 A | 9/2000 | Estakhri et al. | | EP | 0 722 585 B1 | 5/2002 |
| 6,122,195 A | 9/2000 | Estakhri et al. | | EP | 0 910 826 B1 | 6/2002 |
| 6,125,424 A | 9/2000 | Komatsu et al. | | EP | 0 691 008 B1 | 11/2002 |
| 6,125,435 A | 9/2000 | Estakhri et al. | | EP | 0 861 468 B1 | 4/2003 |
| 6,128,695 A | 10/2000 | Estakhri et al. | | EP | 0 978 040 B1 | 5/2004 |
| 6,134,145 A | 10/2000 | Wong | | EP | 1 157 328 B1 | 5/2005 |
| 6,134,151 A | 10/2000 | Estakhri et al. | | FR | 93 01908 | 8/1993 |
| 6,141,249 A | 10/2000 | Estakhri et al. | | GB | 2 251 323 A | 7/1992 |
| 6,145,051 A | 11/2000 | Estakhri et al. | | GB | 2 291 990 A | 2/1996 |
| 6,172,906 B1 | 1/2001 | Estakhri et al. | | GB | 2 291 991 A | 7/1996 |
| 6,173,362 B1 | 1/2001 | Yoda | | GB | 2 297 637 A | 7/1996 |
| 6,181,118 B1 | 1/2001 | Meehan et al. | | GB | 2 304 428 A | 3/1997 |
| 6,182,162 B1 | 1/2001 | Estakhri et al. | | GB | 2 348 991 B | 12/2002 |
| 6,202,138 B1 | 3/2001 | Estakhri et al. | | GB | 2 351 822 B | 1/2003 |
| 6,223,308 B1 | 4/2001 | Estakhri et al. | | GB | 2 384 337 A | 7/2003 |
| 6,226,708 B1 | 5/2001 | McGoldrick et al. | | GB | 2 384 883 A | 10/2005 |
| 6,230,234 B1 | 5/2001 | Estakhri et al. | | GB | 2 384 338 B | 11/2005 |
| 6,251,247 B1 | 6/2001 | Mitsuhashi et al. | | GB | 2 384 072 B | 12/2005 |
| 6,262,918 B1 | 7/2001 | Estakhri et al. | | GB | 2 411 499 B | 2/2006 |
| 6,272,610 B1 | 8/2001 | Katayama et al. | | IS | 117881 | 5/2003 |
| 6,275,436 B1 | 8/2001 | Tobita et al. | | JP | 59-45695 A | 9/1982 |
| 6,279,069 B1 | 8/2001 | Robinson et al. | | JP | 58-215794 A | 12/1983 |
| 6,279,114 B1 | 8/2001 | Toombs et al. | | JP | 58-215795 A | 12/1983 |
| 6,285,607 B1 | 9/2001 | Sinclair | | JP | 59-162695 A | 9/1984 |
| 6,327,639 B1 | 12/2001 | Asnaashari | | JP | 60-212900 | 10/1985 |

| | | | |
|---|---|---|---|
| JP | 61-96598 A | 5/1986 |
| JP | 62-283496 A | 12/1987 |
| JP | 62-283497 A | 12/1987 |
| JP | 63-183700 A | 7/1988 |
| JP | 1-138694 A | 5/1989 |
| JP | 3-228377 A | 10/1991 |
| JP | 4-57295 A | 2/1992 |
| JP | 4-254994 A | 9/1992 |
| JP | 4-268284 A | 9/1992 |
| JP | 4-278297 A | 10/1992 |
| JP | 4-332999 A | 11/1992 |
| JP | 5-128877 A | 5/1993 |
| JP | 5-282883 A | 10/1993 |
| JP | 6-36578 A | 2/1994 |
| JP | 6-124175 A | 5/1994 |
| JP | 6-124231 A | 5/1994 |
| JP | 6-131889 A | 5/1994 |
| JP | 6-132747 A | 5/1994 |
| JP | 6-149395 A | 5/1994 |
| JP | 6-266596 A | 9/1994 |
| JP | 7-93499 A | 4/1995 |
| JP | 7-311708 A | 11/1995 |
| JP | 8-19018 A | 1/1996 |
| JP | 8-69696 A | 3/1996 |
| JP | 9-147581 A | 6/1997 |
| SU | 1388877 A1 | 4/1988 |
| SU | 1408439 A1 | 7/1988 |
| SU | 1512164 A1 | 10/1989 |
| SU | 1541619 A1 | 2/1990 |
| SU | 1573458 A2 | 6/1990 |
| SU | 1686449 A2 | 10/1991 |
| WO | WO 84/00628 | 2/1984 |
| WO | WO 94/20906 A1 | 9/1994 |

OTHER PUBLICATIONS

Ross S. Finlayson and David R. Cheriton, An Extended File Service Exploiting Write-Once Storage, article, 1987, 10 pgs. ACM.
Jason Gait, The Optical File Cabinet: A Random-Access File System for Write-Once Optical Disks, article, Jun. 1988, 12 pgs., Beaverton, Oregon.
Henry G. Baker, Memory Managment, book, 1995, 19 pgs., Springer-Verlag Berlin Heidelberg, Germany.
Sape J. Mullender and Andrew S. Tanenbaum, A Distributed File Service Based on Optimistic Concurrency Control, article, 1985, 12 pgs., ACM.
Hiroshi Nakamura, Junichi Miyamoto, Kenichi Imamiya and Yoshihisa Iwata, A Novel Sense Amplifier for Flexible Voltage Operation NAND Flash Memories, symposium, 1995, VLSI Circuits Digest of Technical Papers., 2 pgs.
Hiroshi Nakamura, Junichi Miyamoto, Kenichi Imamiya, Yoshihisa Iwata, Yoshihisa Sugiura and Hideko Oodaira, A Novel Sensing Scheme with On-Chip Page Copy for Flexible Voltage NAND Flash Memories, article, Jun. 1996, 9 pgs.., vol. E79-C, No. 6.
Takaaki Nozaki, Toshiaki Tanaka, Yoshiro Kijiya, Eita Kinoshita, Tatsuo Tsuchiya and Yutaka Hayashi, A 1-Mb EEPROM with MONOS Memory Cell for Semiconductor Disk Application, article, 1991, 5 pgs., Journal Of Solid -State Circuits, vol. 26, No. 4.
Kai Hwang and Faye A. Briggs, Computer Architecture and Parallel Processing, book 1984, McGraw-Hill, Inc., 2 pgs., US.
Walter Lahti and Dean McCarron, State of the Art: Magnetic VS. Optical Store Data in a Flash, article, 1990, 7 pgs., vol. 15, No. 12, McGraw-Hill, Inc., US.
Ron Wilson, Integrated Circuits; 1-Mbit flash memories seek their role in system design, article, Mar. 1, 1989, 2 pgs., No. 6, Tulsa, OK.
S. Mehroura, J.H. Yuan, R.A. Cemea, W.Y. Chien, D.C. Guteman, G. Samachisa, R.D. Noman, M. Mofidi, W. Lee, Y. Fong, A. Mihnea , E. Hann, R.W. Gregor, E.P. Eberhardt, J.R. Radosevich, K.R. Stiles, R.A. Kohler, C.W. Leung, and T.J. Mulrooney, Serial 9Mb F EEPROM for Solid State Disk Applications, symposium, 1992, 2 pgs., Mountain View, CA.
Steven M. Leibson, Nonvolatile, In-circuit-reprogrammable memories, article, Jan. 3, 1991, 12 pgs., EDN, Curcle No. 12.
Ramon Caceres, Fred Douglas, Kai Li and Brain Marsh, Operationg System Implications of Solid-State Mobile Computers, article, 7 pgs., Oct. 1993, Workshop on Workstation Operting Systems.
Michael Wu and Wily Zwaenepoel, A Non-Volatile, Main Memory Storage System, 12 pgs., 1994, ACM, San Jose, CA USA.
Dave Bursky, Innovative flash memories match DRAM densities: available with a choice of features, flash memories are finding homes in many systems (includes related articles on the origins of flash, and on the differences between NAND and NOR flash memories), article, May 16, 1994, 9 pgs., Electronic Design, v.42,n. 10, The Gale Group.
Anthony Cataldo, New flash enhancements up ante. (Intel's 28F400BV-120 and 28F004BV-120, Atmel's AT29BV010 and AT29BV020, and Samsung Semiconductor's KM29V32000 "flash memory" devices)(Product Annoucement), article, Mar. 13, 1995, 4 pgs., Electronic News, v.41, n.2056, The Gale Group.
Sam Weber, "Flash" modules' portability, reusability, small size valued for a host of APPs-Comsumer formats flocking to "flash", article, Jul. 22, 1996, 9 pgs., Electronic Engineering Times, n.911, CMP Media.
Toshiba, MOS Memory (Non-Volatile), 1995, Data Book.
Stan Baker, But Integration Calls for Hardware, Software Changes: Flash: designers face the dawn of a new memory age, article, Sep. 12, 2003, 5 pgs., Electronic Engineering Times, 1990, N.619, 41, CMP Media.
Toshiba, Toshiba MOS Digital Integrated Circuits Silicon Gate CMOS, (TC58NS512DC) Mar. 21, 2001, 43 pgs., Data Book.
Toshiba Corporation, SMIL (Smartmedia Interface Library) Hardware Edition Version 1.00, Jul. 1, 2000, 36 pgs., Data Book.
Toshiba, Toshiba MOS Digital Integrated Circuit Silicon Gate, (TC58512FT), Mar. 5, 2001, 43 pgs., Data Book.
Toshiba, Toshiba MOS Digital Integrated Circuit Silicon Gate, (TC58DVM92A1FT00), Jan. 10, 2003, 44 pgs., Data Book.
Toshiba, Toshiba MOS Digital Integrated Circuit Silicon Gate, (TC58DVG02A1FT00), Jan. 10, 2003, 44 pgs., Data Book.
Toshiba, Toshiba MOS Digital Integrated Circuit Silicon Gate, (TH58100FT), Mar. 5, 2001, 43 pgs., Data Book.
35Nonvolatile Memory Technology Review, A Time of Change, Proceedings 1993 Conference, Jun. 22-24, 1993, Linthicum Heights, MD USA.
Toshiba Corporation, SMIL (Smartmedia Interface Library) Software Edition Version 1.00, Jul. 1, 2000, 136 pgs., Data Book.
Toshiba, MOS Memory (Non-Volatile), 1996, 279 pgs., Data Book.
Dan Auclair, Optimal Solid State Disk Architecture For Portable Computers, symposium, Jul. 9, 1991, 7 pgs., SunDisk Corporation.
Book-Computer Architecture and Parallel Processing, Kai Hwang & Faye A. Briggs, McGraw-Hill Book Co. Copyright 1984, p. 64.
Magazine-State of the Art: Magnetic VS> Optical Store Data in a Flash:, by Walter Lahti and Dean McCarron, Byte magazine date Nov. 1, 1990.311, vol. 15, No. 12.
Magazine-Technology Updates, Integarted Cirrcuitsk, "1-Mbit flash memories seek their role in system design", Ron Wilson, Senior Editior, Computer Design magazine 28, Mar. 1, 1989, No. 5, Tulsa OK, US, pp. 30 and 32.
1992 Symposium of VLSI Circuits Digest of Technical Papers, "EEPROM for Solid State Disk Application". S.Mehoura et al., SunDisk Corporation, Santa Clara CA.R.W. Gregor et al., AT&T Bell Laboratories, Allentown, PA. pp. 24 and 25.
Mendel Rosenblum and John K. Ousterhout, The Design and Implementation of a Log-Structured File System, article, 1991, 15 pgs., Berkeley, USA.
Brian Dipert and Markus Levy, Designing with Flash Memory, book, Apr. 1994, 445 pgs., Annabooks, San Diego, USA.
Flash Memory Business Symposium '95, Sep. 19, 1995, Science Forum, Inc., Bunkyo-ku, Tokyo.
Ross S. Finlayson and David R. Cheriton, An Extended File Service Exploiting Write-Once Storage, article, 1987, 10 pgs. ACM.
Jason Gait, The Optical File Cabinet: A Random-Access File System for Write-Once Optical Disks, article, Jun. 1988, 12 pgs., Beaverton, Oregon.
Henry G. Baker, Memory Management, book, 1995, 19 pgs., Springer-Verlag Berlin Heidelberg, Germany.

Sape J. Mullender and Andrew S. Tanenbaum, A Distributed File Service Based on Optimistic Concurrency Control, article, 1985, 12 pgs., ACM.

Hiroshi Nakamura, Junichi Miyamoto, Kenichi Mamiya and Yoshihisa Iwata, A Novel Sense Amplifier for Flexible Voltage Operation NAND Flash Memories, symposium, 1995, VLSI Circuits Digest of Technical Papers., 2 pgs.

Hiroshi Nakamura, Junichi Miyamoto, Kenichi Imamya, Yoshihisa Iwata, Yoshihisa Sugiura and Hideko Ookaira, A Novel Sensing Scheme with On-Chip Page Copy for Flexible Voltage NAND Flash Memories, article, Jun. 1996, 9 pgs.., vol. E79-C, No.6.

Takaaki Nozaki, Toshiaki Tanaka, Yoshiro Kijiya, Eita kinoshita, Tatsuo and Yutaka Hayashi, A 1-Mb EEPROM with MONOS Memory Cell for Semiconductor Disk Application, article, 1991, 5 pgs., Journal of Solid - State Circuits, vol. 26, No. 4.

Walter Lahti and Dean McCarron, State of the Art: Magnetic VS. Optical Store Data in a Flash, article. 1990, 7 pgs., vol. 15, No. 12, McGraw-Hill, Inc., US.

Ron Wilson, Integrated Circuits: 1-Mbit flash memories seek their role in system design, article Mar. 1, 1989, 2 pgs., No. 6, Tulsa, OK.

S. Mehroura, J.H. Yuan, R.A. Cemea, W.Y. Chien, D.C. Guteman, G. Samachisa, R.D. Noman, M. Mofidi, W.Lee, Y. Fong, A. Mihnea, E. Hann, R.W. Gregor, E.P. Eberhardt, J.R. Radosevich, K.R. Stiles, R.A. Kohler, C.W. Leung, and T.J. Mulrooney, Serial 9mb F EEPROM for Solid State Disk Applications, symposium, 1992, 2pgs., Mountain View, CA.

Steven H. Leibson, Nonvolatile, in-circuit-reprogrammable memories, article, Jan. 3, 1991, 12 pgs., EDN Circle No. 12.

Ramon Caceres, Fred Douglis, Kai Li and Brian Marsh, Operating System Implications of Solid-State Mobile Computers, article, 7 pgs., Oct. 1993, Workshop on Workstation Operating Systems.

Michael Wu and Wily Zwaenepoel, A Non-Volatile, Main Memory Storage System, 12 pgs., 1994, ACM, San Jose, CA, USA.

Dave Bursky, Innovative flash memories match DRAM densities: available with a choice of features, flash memories are find homes in many systems (includes related articles on the origins of flash, and on the differences between NAND and NOR flash memories). article, May 16, 1994, 9 pgs., Electronic Design, v.42, n. 10, The Gale Group.

Anthony Cataldo, New flash enhancements up ante. (Intel's 28F4008V-120 and 28F004BV-120, Atmel's AT29BV010 and AT29BV020, and Samsung Semiconductor's KM29V32000 "flash memory" devices)(Product Announcements), article, Mar. 13, 1995, 4 pgs., Electronic News, v.41, n.2056, The Gale Group.

Sam Weber, "Flash"Modules portability, resuability, small size valued for a host of APPs-Consumer formats flocking to "flash", article, Jul. 22, 1996, 9 pgs., Electronic Engineering Times, n.911, CMP Media.

Toshiba, MOS Memory (Non-Volatile), 1995, Data Book.

Stan Baker, But Integration Calls for Hardware, Software Changes: Flash: designers face the dawn of a new memory age, article, Sep. 12, 2003, 5 pgs., Electronic Engineering Times, 1990, N.619,41 CMP Media.

Toshiba, Toshiba MOS Digital Integrated Circuit Silicon Gate CMOS. (TC58NS512DC) Mar. 21, 2001, 43 pgs., Data Book.

Toshiba Corporation, SMIL (Smartmedia Interface Library) Hardware Edition Version 1.00, Jul. 1, 2000, 38 pgs., Data Book.

Toshiba, Toshiba MOS Digital Integrated Circuit Silicon Gate, (TC58512FT), Mar. 5, 2001, 43 pgs., Data Book.

Toshiba, Toshiba MOS Digital Integrated Circuit Silicon Gate, (TC58DVM2A1FT00), Jan. 10, 2003, 44 pgs., Data Book.

Toshiba, Toshiba MOS Digital Integrated Circuit Silicon Gate, (TC58DVG02A1FT00), Jan. 10, 2003, 44 pgs., Data Book.

Toshiba, Toshiba MOS Digital Integrated Circuit Silicon Gate, (TH58100FT), Mar. 5, 2001, 43 pgs., Data Book.

35Nonvolatile Memory Technology Review, A Time of Change, Proceedings 1993 Conference, Jun. 22-24, 1993, Linthicum Heights, MD USA.

Toshiba Corporation, SMIL (Smartmedia Interface Library) Software Edition Version 1.00, Jul. 1, 2000, 136 pgs., Data Book.

Toshiba, MOS Memory (Non-Volatile), 1996, 279 pgs., Data Book.

Dan Auclair, Optimal Solid State Disk Architecture for Portable Computers, symposium, Jul. 9, 1991, 7 pgs., SunDisk Corporation.

200 — Find a New Block when it is Free

| VLBA 0 | BLK 0 |
|---|---|
| | Sector 0 |
| | Sector 1 |
| | Sector 2 |
| | Sector 3 |
| | Sector 4 |
| | Sector 5 |
| | Sector 6 |
| | Sector 7 |

| VLBA 62 | BLK 1 |
|---|---|
| | Sector 496 |
| | Sector 497 |
| | Sector 498 |
| | Sector 499 |
| | . |
| | . |
| | . |
| | B (0) Sector 503 |

| VLBA 1 | BLK 2 |
|---|---|
| | 8 |
| | 9 |
| | 10 |
| | 11 |
| | 12 |
| | . |
| | . |
| | . |
| | 15 |

| VLBA 6 | BLK 3 |
|---|---|
| | 48 |
| | 49 |
| | 50 |
| | 51 |
| | . |
| | . |
| | . |
| | 55 |

*FIG. 1b*
(Prior Art)

200
Find a New Block when it is Free

VLBA 0 — BLK 4
| B (N+M) Sector 0 | —202 |
| B (N+M) Sector 1 | —204 |
| B (N+M) Sector 2 | —206 |
| B (N+M) Sector 3 | —208 |
| B (0) Sector 4 | —210 |
| B (0) Sector 5 | —212 |
| B (0) Sector 6 | —214 |
| B (0) Sector 7 | —216 |

VLBA 62 — BLK 5
| B (N+M) Sector 496 | —250 |
| B (N+M) Sector 497 | —252 |
| B (N+M) Sector 498 | —254 |
| B (0) Sector 499 | —256 |
| ⋮ | |
| B (0) Sector 503 | —264 |

VLBA 1 — BLK 6
| B (2) 8 | —218 |
| B (2) 9 | —220 |
| B (N) 10 | —222 |
| B (N) 11 | —224 |
| B (2) 12 | —226 |
| ⋮ | |
| B (2) 15 | —232 |

VLBA 6 — BLK 7
| B (3) 48 |
| B (3) 49 |
| B (N+M) 50 |
| B (3) 51 |
| ⋮ |
| B (3) 55 |

*FIG. 3*

BLOCK MANAGEMENT FOR MASS STORAGE

CROSS REFERENCE TO RELATED APPLICATIONS

This application is a continuation-in-part of my U.S. patent application Ser. No. 09/620,544, filed on Jul. 21, 2000 now U.S. Pat. No. 6,978,342 issued on Dec. 20, 2005 and entitled "Moving Sectors Within a Block of Information In a Flash Memory Mass Storage Architecture", the disclosure of which is incorporated herein by reference as though set forth in full.

BACKGROUND OF THE INVENTION

1. Field of the Invention

The present invention relates generally to methods and apparatus for improving the performance of file management within nonvolatile memory devices and particularly to increasing the speed of writing or storing information to such nonvolatile memory devices.

2. Description of the Prior Art

Various prior art methods and techniques were used to manage files, i.e. store data and read back data, within nonvolatile memory devices. Generally, a host device commands a controller, coupled between the host device and nonvolatile memory, to store certain information within nonvolatile memory and later to read the same. Such information depends on the application of the nonvolatile memory device. For example, in the case of digital cameras, digital pictures or photos is the information stored and retrieve from nonvolatile memory. In the case of Personal Computers (PCs), information is stored and retrieved from hard disk.

Since information is typically organized in sectors, each sector including a predetermined number of user data and a predetermined number of overhead data, the host commands the controller to store sector information by referencing addresses associated with particular sectors. For example, there may be sectors 0 through N and each group of sectors may define a block which would also have an address associated therewith for identifying the same. The controller uses sector addresses to organize digital information within the nonvolatile memory device.

In one prior art technique, as a part of file management of nonvolatile memory, when the host device commands the controller to write or store information to one or more particular sectors, identified by logical block addresses (LBAs), the controller writes to physical block addresses (PBAs) in the nonvolatile memory. Each block includes a very large amount of nonvolatile memory space, for example, 64 Kbytes. When a particular sector is updated or re-written thereto in nonvolatile memory, the controller writes the updated sector information to another location within the 64 Kbyte block space. To keep track of the current sector information, flags and address information are utilized and are updated by the controller to reflect the status of the sector. U.S. Pat. No. 5,341,330, issued on Aug. 23, 1994 to Wells et al. and entitled "Method For Writing to a Flash Memory Array During Erase Suspend Intervals" is an example of the teachings of such prior art technique. In the case where a particular sector is updated within a block, the sector location including previous information is marked 'old' utilizing a flag and the new or current sector location is marked 'new'. Finally, when the block is full, i.e. no free or available location remains, a new block is used to store further updates to sectors and the old block is eventually erased prior to being re-utilized.

An example of the above discussion is perhaps better shown by reference to the example of FIG. 1 depicting a block 10 and a block 12, each of which include 64 Kbytes of storage area organized into sector locations for storing sector information. The number of sector locations included within a block is a function of the size of each sector. In the case, for example, where each sector includes 512 bytes, the number of sectors included within a block having 64 Kbytes is obviously 64×1024 divided by 512 or 128.

Referring still to FIG. 1, when the host writes to a sector location identified by LBA 0, the controller stores said information into 14 and associated flag(s) are set to 'new' the first time such a write or store operation takes place after erasure of the block 10. However, after following writes to the same sector, eventually, sector 0 at 14 will be set to 'old' indicating that the information stored therein is no longer current and that the controller should read another location to obtain the latest sector 0 information. This occurs when sector 0 is re-written or updated a following time and because information at 14 cannot be re-written without the block 10 first being erased. Since no erasure of block 10 has taken place, the next time sector 0 is written, its information will be placed at 28 and while the flag for location 14 will be set to 'old', the flag for location 28 is set to 'new' indicative of the most up-to-date sector 0 information until the latter is again updated, at which time the current information is stored for location 44 in block 10 and the flag at 44 is set to 'new' while the flag for location 28 is set to 'old'.

The scenario described above applies to the writing or updating of all other sectors. By brief way of example, sector information identified by LBA 1, is initially written at 16 and the next time it is written, it is written to the next available location in Block 10 which is location 30 and the following time after that when it is written by the host, it is written at 36 and the flags of 16, 30 and 36 are updated as describe above. This process continues until the block 10 becomes full at which time a new, or available, or free block is found by the controller, in this case, block 12. From thereon, updated sector information is written to the block 12, not only this, but at some point, if necessary, all sector locations including current sector information are moved to the block 12, as explained in U.S. Pat. No. 5,341,330.

For example, in FIG. 1, after the first time when the sector identified by LBA 50 is written, assuming the host commands the controller to write to LBA 50 a next time and the block 10 is found to be full, the re-writing of sector 50 takes place within the block 12 rather than the block 10. In fact, the re-written sector 50 information is written at 50 and all other sectors designated as having current or 'new' sector information are moved to the block 12. This includes the sector identified by LBA 901, which is at 24 in block 10 and moved to 52 in block 12, the sector identified by LBA 902, which is at 26 in block 10 and moved to 54 in block 12, the sector identified by LBA 900, which is at 34 in block 10 and moved to 56 in block 12 (note that this sector was initially written at 22 but the sector information at 22 is now 'old' and the most recent information resides at 34, which is the reason for moving the information stored at 34 rather than the information at 22), the sector identified by LBA 1, which is at 36 in block 10 and moved to 58 in block 12 and so on.

The above prior art technique is described in further detail in U.S. patent No. 6,978,342, on Dec. 20, 2005 and entitled "Moving Sectors Within a Block of Information In a Flash Memory Mass Storage Archititure", the disclosure of which is incorporated herein by reference as though set forth in full.

The problem with this technique is that to move all of the sectors including current information to another new block is time-consuming and therefore a performance hindrance. This problem is even further exaggerated when using smaller block sizes as there are more numerous move operations with smaller block sizes and smaller block sizes are more prevalent by today's users of nonvolatile memory devices.

In the patent document referred to hereinabove, a method and apparatus is introduced for improving the performance of managing files or data within nonvolatile memory by organizing the memory into smaller block sizes and introducing a virtual logical block address (VLBA) to PBA relationship and a unique VLBA was assigned to each block and within each VLBA were sectors arranged in sequential order for decreasing the number of moves to expedite or improve the performance of the system through the use of mapping of PBAs to VLBAs. This VLBA to PBA mapping caused the size of the space manager within the controller device to decrease thereby resulting in a less expensive manufacturing of the controller device. However, in this method, it is presumed that sectors are written in sequential order by the host, if this is not the case, there is much wasted memory space.

In further explanation of prior art techniques, FIG. 1(a) shows another method for updating sector information in that when sector information is re-written by a host, the new or updated information need be written to a free block. For example, as shown in FIG. 1(a), when sector information, identified by LBA 0 in Block 0, is re-written or updated, the updated LBA 0 sector information is written to LBA 0 of Block 1. All other sectors within the Block 0 need then be moved to Block 1. Accordingly, every time there is a re-write or update of a sector, an entire block of information is moved to a new or free block. Obviously, this adversely affects system performance because every time there is a re-write of a sector, a new location within a free block is written thereto while the old information remains in the previous block until the system erases the latter.

In yet another prior art technique, sectors are not moved necessarily right away after every sector information update, rather, re-writes and move operations are kept track thereof and when a block is full or nearly full of mostly old sector information, its current sector information is then moved to a new block. For example, as shown in FIG. 1(b), when sector information to LBA 0 is updated, it is written to an available sector location in an available or free block but the remaining sectors of the previous block are not moved to the new block. Thus the previous block continues to hold some current sector information as well as some old sector information. The system keeps track of rewrites so that it has knowledge of which sectors are old and which are current and when a block is full or nearly full of old sector information, it moves the current sector information, if any, to the new of available block.

Thus, the need arises for a system and method for file or data management of information that is organized into sectors within nonvolatile memory devices while improving the performance for doing the same in an inexpensive manner.

SUMMARY OF THE INVENTION

Briefly, an embodiment of the present invention includes a nonvolatile memory system comprising nonvolatile memory for storing sector information, the nonvolatile memory being organized into blocks with each block including a plurality of sectors, each sector identified by a logical block address and for storing sector information. A controller is coupled to the nonvolatile memory for writing sector information to the latter and for updating the sector information, wherein upon updating sector information, the controller writes to the next free or available sector(s) of a block such that upon multiple re-writes or updating of sector information, a plurality of blocks are substantially filled with sector information and upon such time, the controller rearranges the updated sector information in sequential order based on their respective logical block addresses thereby increasing system performance and improving manufacturing costs of the controller.

The foregoing and other objects, features and advantages of the present invention will be apparent from the following detailed description of the preferred embodiments which make reference to several figures of the drawing.

IN THE DRAWINGS

FIG. 1(b) shows yet another example of a prior art technique for moving sector information upon re-write or updating operations.

FIG. 3 illustrates the notion of finding free blocks by the controller and using the same for re-arranging sector information in accordance with a method of the present invention.

Figure 4:
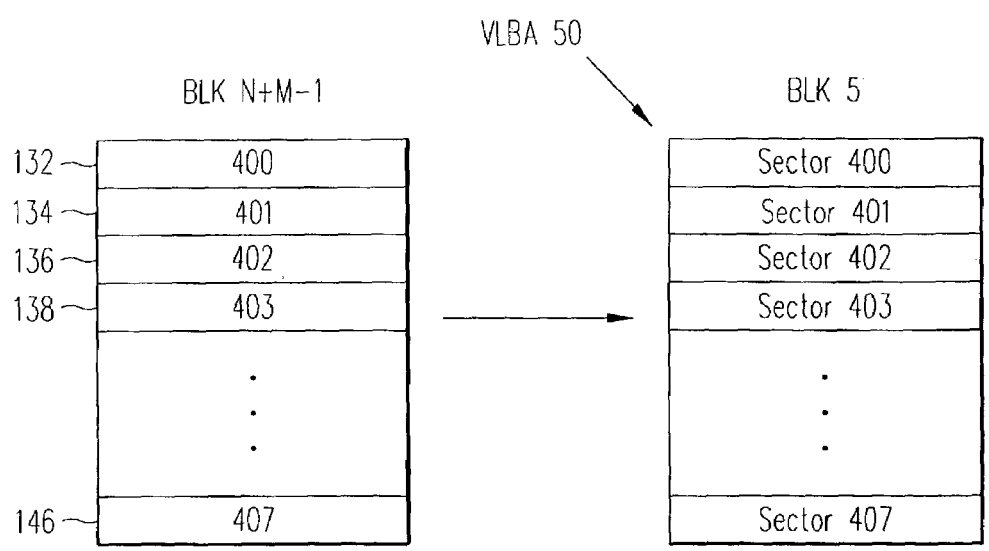
Figure 2:
FIG. 2 shows an example of the organization of information within nonvolatile memory devices is shown, in accordance with an embodiment of the present invention.

FIG. 4 further expands on the example of FIG. 2.

DETAILED DESCRIPTION OF THE PREFERRED EMBODIMENTS

Referring now to FIG. 2, an example of the organization of information within nonvolatile memory devices is shown, in accordance with an embodiment of the present invention, to include M number of blocks 100, M being an integer with each block including sector information. As will be apparent shortly, the blocks 100 are temporary locations for storage of sector information commanded to be written by the host through a controller device. The blocks 100 are shown to include Block N, Block N+M and Block N+M−1, wherein N is also an integer number. The reason for the notation N is to emphasize that Block N and in fact Blocks N+M and N+M−1 can be any one of the blocks within a nonvolatile memory. In one embodiment of the present invention, four blocks are designated as the blocks within 100 and thus temporary locations for storing data or information received from the host but in other embodiments of the present invention, any number of blocks may be employed.

In one embodiment of the present invention, each block includes 8 sectors but again, any number of sectors may be assigned to a block without departing from the scope and spirit of the present invention. Thus, in FIG. 2, Block N includes eight sector locations, as does Block N+M and Block N+M−1. In the example of FIG. 2, when the host initially writes a sector identified by the LBA 0, this information is placed in the first sector location of Block N, at 102. Next, if the host writes information to a sector identified by LBA 1, this information is placed at the next available location within Block N at 104 and assuming the host next writes to a sector identified by the LBA 10, the same is stored at 106, followed by a host write to a sector identified by LBA 11, which is written at 108, LBA 50, which is written at 110, LBA 596, written at 112 and LBA 597 at 114 and 598 at 116. These are all shown to have been written to Block N.

In this example, the next time the host rewrites to or updates the sector identified by LBA 0, this information is stored in Block N+M, at its first sector location, 116 and at such time, the information at 102 in Block N is designated as being 'old' through the use of a flag or other means while the sector information at 117 is designated as 'new'. The same events occur when the scenario repeats itself for the updating of sector 1 where the location at 104 in Block N is designated as being 'old' and the location at 118 in Block N+M is designated as 'new' through the use of their respective flags.

The following sectors to be written, namely the sectors identified by LBAs 2, 3, 50, 496, 497 and 498, are also stored in Block N+M at 120–130, respectively. As shown, the sector identified by LBA 50 was previously written by the host and stored at 110 in Block N so that when it is updated, the new sector information is stored at 124 in Block N+M and the flag at 110 is modified to indicate 'old' whereas the flag at 124 is modified to indicate 'new'.

In the example of FIG. 2, the following sector writes are of sectors of sequential LBA order. This sector information are stored in block N+M−1 at 132–146, respectively. That is, the sector identified by LBA 400 is stored at 132, the next sector, identified by LBA 402 is stored at 134 and so on until the eight sequential sectors are stored within the Block N+M−1.

At a time when all of the blocks 100 are filled with sector information or at the right time, the controller performs a 'clean-up' operation, arranging the sectors in sequential order within blocks other than those included with the blocks 100 thus enabling the space manager within the controller device to avoid maintaining track of information stored within nonvolatile memory on a sector-by-sector basis thereby improving manufacturing costs associated with the controller device by the latter having a smaller space manager requirement. Additionally, as will be evident, the number of move operations of sectors is reduced thereby increasing system performance.

Referring now to FIG. 3, free blocks are found by the controller and used for re-arranging sector information. In this example, as noted above, four blocks are employed while other number of blocks may be used without departing from the spirit and scope of the present invention.

In FIG. 3, blocks 200 are shown to include four blocks, namely Block 4, Block 5, Block 6 and Block 7. Again, these blocks need not be Blocks 4–7 and can be any free blocks found by the controller. Each VLBA identifies a unique block having eight sectors. For example, VLBA0 identifies Block 4, VLBA 1 identified Block 6, VLBA 2 identifies Block 5 and VLBA 6 identified Block 7. It is important to note that the numbering of the VLBAs is a function of the sequential order of the LBAs associated with sectors. That is, sectors identified by LBA 0–7 will be located in VLBA0 and the next eight sectors, LBA 8–15 will be in VLBA 1 and the next eight (not shown in FIG. 3) will be in VLBA 2 and sectors identified by LBAs 496, 497, 498 through 503 are at VLBA 62 because 496 divided by 8 is 62, and sectors identified by LBAs 48 through 55 are at VLBA 6 and so on.

Figure 1:
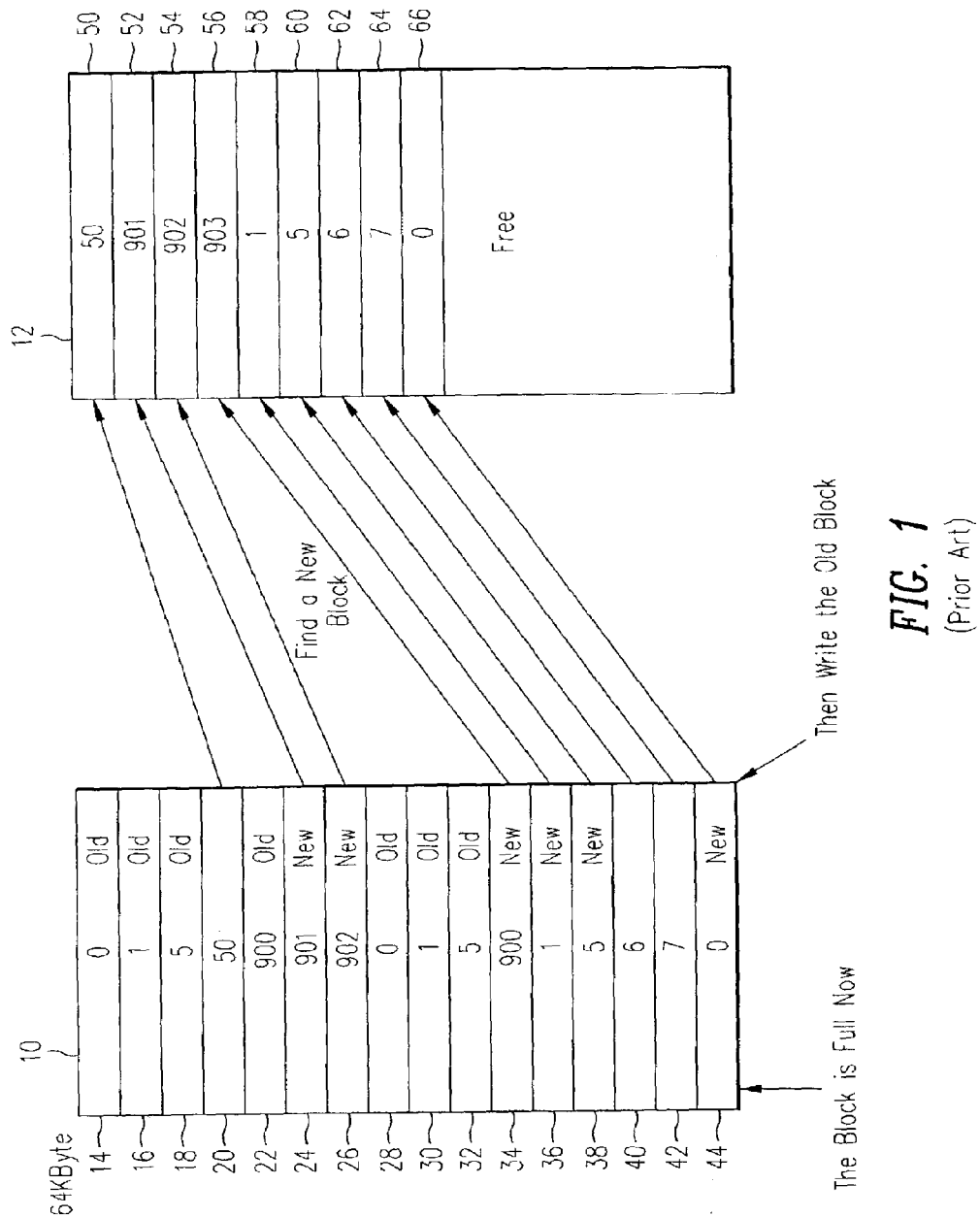
FIG. 1 shows an example of a prior art technique for moving sector information upon re-write or updating operations.
Figure 1A:
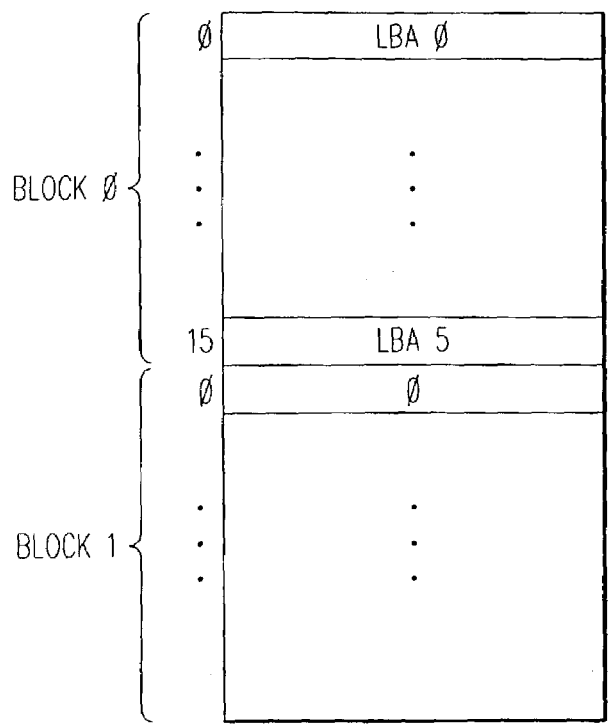
FIG. 1(a) shows another example of a prior art technique for moving sector information upon re-write or updating operations.

During 'clean-up', the sectors of FIG. 2 having current sector information (not 'old' information) are re-arranged into sequential order and placed within the blocks 200 of FIG. 3. Starting with sector 0, the sector identified by LBA 0, is moved from 117 (in FIG. 2) to 202 in FIG. 3. That is, the current sector 0 information, which now resides in Block N+M rather than Block N, is moved to the first location of Block 4, at 202. The sector that is in the next sequential order, i.e. sector 1, is found in the blocks 100 of FIG. 2, at 118 and moved to 204 in FIG. 3 (whenever reference is made throughout this document to moving a sector, the information within the sector or sector information is what is physically moved). Sector 2 is found at 120 in Block N+M in FIG. 2 and moved to 206 in FIG. 3 and sector 3 is found at 122 in FIG. 2 and moved to 208 in FIG. 3. The next sequentially-ordered sector, sector 4 is found in Block 0 (shown in FIG. 1(*b*)) and moved to 210 in FIG. 3 and the following 3 sectors follow at 212, 214 and 216 in FIG. 3.

The following eight sectors are sequentially placed within the block identified by VLBA 1 in FIG. 3. Each of these sectors is also found from various temporary block locations within blocks 100 in FIG. 2 and moved to the locations 218–232, respectively. That is, sectors 8 and 9 are found in Block 2 (shown in FIG. 1(*b*)) and moved to 218 and 220, respectively. Sectors 10–11 are found at 104 and 106, respectively in Block N of FIG. 2 and remaining sectors 12–15 are found in Block 2 (shown in FIG. 1(*b*)) and placed at 226–232, respectively.

In FIG. 3, VLBA 62 is shown to include information for sectors 496–503 with sectors 496–498 being moved from Block N+M at 124–130 of FIG. 2, respectively, to 250–254 of VLBA 62 of FIG. 3, respectively and sectors 499–503 being moved from Block 1, not shown in FIG. 2, to 256–264 in FIG. 3, respectively. Without going through the details, in a similar fashion, VLBA 6 of FIG. 3 is updated to include sectors 48–55 from temporary blocks 100.

Referring back to FIG. 2, Block N+M−1 includes sectors that are already in sequential order, as noted above, since the host wrote them in sequential order. Accordingly, there is no need to move these sectors into another block for the purpose of reorganizing them into sequential order. Rather, Block N+M−1 is renumbered as VLBA Block 50 (this is due to sectors 400 as divided into 8 being 50) and taken out of temporary blocks 100 and considered among the blocks 200 of FIG. 3. Thus as shown in FIG. 4, no moves are required for sectors 400–408 saving a number of operations that substantially increases the system performance. In fact, the more the number of sequential writes of at least a number of sectors equal to the number of sectors within a block, the greater the system performance due to a lesser number of move operations.

Although the present invention has been described in terms of specific embodiments it is anticipated that alterations and modifications thereof will no doubt become apparent to those skilled in the art. It is therefore intended that the following claims be interpreted as covering all such alterations and modification as fall within the true spirit and scope of the invention.

What is claimed is:

1. A nonvolatile memory system comprising:
    nonvolatile memory for storing sector information, said nonvolatile memory being organized into blocks, each block including a plurality of sectors, each sector identified by a logical block address and for storing sector information; and
    a controller coupled to said nonvolatile memory responsive to a host for writing sector information to said nonvolatile memory and responsive to the host for updating said sector information, wherein upon updating sector information, the controller writes to the next free or available sector(s) of a block such that upon multiple re-writes or updating of sector information, one or more blocks are filled with sector information and upon such time, the controller rearranges the updated sector information in sequential order based on their respective logical block addresses thereby increasing system performance.

2. A nonvolatile memory system as recited in claim 1 wherein free blocks are used to rearrange the updated sector information.

3. A nonvolatile memory system as recited in claim 1 wherein the controller is responsive to the host for writing a plurality of sectors initially arranged in sequential order based on their logical block addresses wherein rearranging these sectors into another block is avoided by the controller thereby saving move operations and improving system performance.

4. A nonvolatile memory system as recited in claim 3 wherein the plurality of sectors is written to a particular block.

5. A nonvolatile memory system as recited in claim 4 wherein the particular block is renumbered.

6. A method of storing sector information in nonvolatile memory organized into blocks, each block including a plurality of sectors, each sector identified by a logical block address comprising:

receiving sector information for storage into a block of the nonvolatile memory;

storing the received sector information into one or more blocks;

receiving updated sector information for storage into a block of the nonvolatile memory;

storing the received updated sector information into the next free or available sector(s) of a block such that upon multiple re-writes or updating of sector information, one or more blocks are filled with sector information; and if needed, moving the updated sector information in sequential order based on their respective logical block addresses.

7. A method of storing sector information in nonvolatile memory organized into blocks, each block including a plurality of sectors, each sector identified by a logical block address comprising:

receiving sector information for storage into a block of the nonvolatile memory;

storing the received sector information into one or more blocks;

receiving updated sector information for storage into a block of the nonvolatile memory;

storing the received updated sector information into the next free or available sector(s) of a block such that upon multiple re-writes or updating of sector information, one or more blocks are filled with sector information; and avoiding moving the updated sector information if the updated sector information belong to sectors of a predetermined order and the logical block addresses of the sectors of the updated sector information correspond to valid physical block addresses used to identify sectors within the nonvolatile memory.

8. A method of storing sector information as recited in claim 7 wherein the avoiding step further includes updating the correspondence between logical block addresses and physical block addresses based upon the updated sector information.

9. A method of storing sector information as recited in claim 8 further including the step of erasing the block that includes sector information which is superceded by the updated sector information.

10. A method of storing sector information in nonvolatile memory organized into blocks, each block including a plurality of sectors, each sector identified by a logical block address comprising:

receiving sector information for storage into a block of the nonvolatile memory;

storing the received sector information into one or more blocks;

receiving updated sector information for storage into a block of the nonvolatile memory;

storing the received updated sector information into the next free or available sector(s) of a block such that upon multiple re-writes or updating of sector information, one or more blocks are filled with sector information; and if needed, moving the updated sector information into sectors identified within the nonvolatile memory by virtual physical block addresses corresponding to respective virtual logical block addresses and avoiding moving the updated sector information if the updated sector information belongs to sectors of a predetermined order and the virtual logical block addresses associated with sectors of the updated sector information correspond to valid virtual physical block addresses.

\* \* \* \* \*